United States Patent
Lin et al.

(10) Patent No.: US 11,527,442 B2
(45) Date of Patent: Dec. 13, 2022

(54) FIN FIELD-EFFECT TRANSISTOR DEVICE AND METHOD OF FORMING THE SAME

(71) Applicant: Taiwan Semiconductor Manufacturing Co., Ltd., Hsinchu (TW)

(72) Inventors: Che-Yu Lin, Hsinchu (TW); Chien-Wei Lee, Kaohsiung (TW); Chien-Hung Chen, Hsinchu (TW); Wen-Chu Hsiao, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 21 days.

(21) Appl. No.: 17/169,090

(22) Filed: Feb. 5, 2021

(65) Prior Publication Data

US 2021/0159122 A1 May 27, 2021

Related U.S. Application Data

(63) Continuation of application No. 16/430,177, filed on Jun. 3, 2019, now Pat. No. 11,088,028.

(60) Provisional application No. 62/773,909, filed on Nov. 30, 2018.

(51) Int. Cl.
| | |
|---|---|
| *H01L 21/8234* | (2006.01) |
| *H01L 21/3065* | (2006.01) |
| *H01L 29/78* | (2006.01) |
| *H01L 29/66* | (2006.01) |
| *H01L 21/02* | (2006.01) |

(52) U.S. Cl.
CPC ........ *H01L 21/823431* (2013.01); *H01L 21/02068* (2013.01); *H01L 21/3065* (2013.01); *H01L 21/823437* (2013.01); *H01L 29/66545* (2013.01); *H01L 29/66795* (2013.01); *H01L 29/785* (2013.01)

(58) Field of Classification Search
CPC ........ H01L 27/0924; H01L 21/823431; H01L 21/823418; H01L 21/823814; H01L 21/32136; H01L 21/02068; H01L 21/3065; H01L 29/66795; H01L 29/785
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 10,176,989 B2 | 1/2019 | Tak |

(Continued)

FOREIGN PATENT DOCUMENTS

| | | |
|---|---|---|
| CN | 108695255 A | 10/2018 |
| KR | 100971414 B1 | 7/2010 |

(Continued)

*Primary Examiner* — Tuan A Hoang
(74) *Attorney, Agent, or Firm* — Slater Matsil, LLP

(57) ABSTRACT

In an embodiment, a method of forming a semiconductor device includes forming a fin protruding above a substrate; forming a gate structure over the fin; forming a recess in the fin and adjacent to the gate structure; performing a wet etch process to clean the recess; treating the recess with a plasma process; and performing a dry etch process to clean the recess after the plasma process and the wet etch process.

20 Claims, 16 Drawing Sheets

(56) References Cited

U.S. PATENT DOCUMENTS

| | | | |
|---|---|---|---|
| 11,088,028 B2* | 8/2021 | Lin | H01L 21/3065 |
| 2002/0006354 A1 | 1/2002 | Aguilera et al. | |
| 2009/0261349 A1 | 10/2009 | Lee et al. | |
| 2012/0302024 A1 | 11/2012 | Lee et al. | |
| 2014/0273493 A1* | 9/2014 | Limdulpaiboon | H01L 27/1462 |
| | | | 438/723 |
| 2014/0282326 A1 | 9/2014 | Chen et al. | |
| 2014/0302678 A1* | 10/2014 | Paterson | H01L 29/66795 |
| | | | 438/700 |
| 2016/0380082 A1 | 12/2016 | Yu et al. | |
| 2018/0097110 A1 | 4/2018 | Yang et al. | |
| 2018/0286676 A1* | 10/2018 | Tak | H01L 21/02656 |
| 2020/0161297 A1 | 5/2020 | Chen et al. | |

FOREIGN PATENT DOCUMENTS

| | | |
|---|---|---|
| KR | 101147383 B1 | 5/2012 |
| KR | 20180110429 A | 10/2018 |

\* cited by examiner

FIN FIELD-EFFECT TRANSISTOR DEVICE AND METHOD OF FORMING THE SAME

PRIORITY CLAIM AND CROSS-REFERENCE

This application is a continuation of U.S. patent application Ser. No. 16/430,177, filed Jun. 3, 2019, which claims priority to U.S. Provisional Patent Application No. 62/773,909, filed Nov. 30, 2018, entitled "Fin Field-Effect Transistor Device and Method of Forming the Same," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
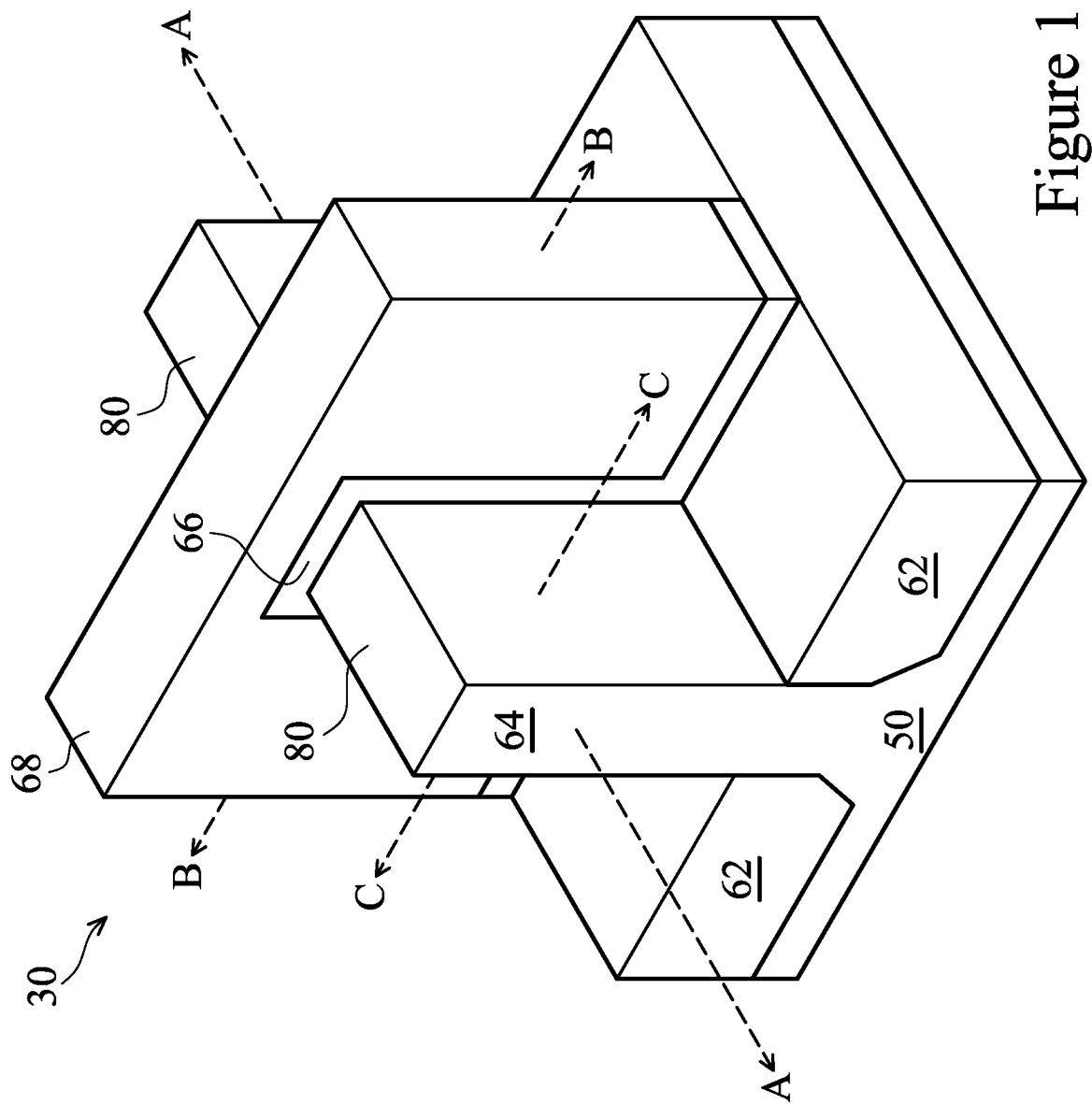
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of cleaning a recess in the fin of a FinFET device in preparation for forming source/drain regions in the recess. Although the disclosed embodiments are discussed using FinFET devices as examples, the disclosed methods may also be used in other types of devices, such as planar devices.

In some embodiments, a cleaning method for cleaning a surface of a semiconductor material includes three cleaning steps performed sequentially. The three cleaning steps include a plasma cleaning step, a wet etch step, and a dry etch step performed sequentially, in an embodiment. In another embodiment, the three cleaning steps include a wet etch step, a plasma cleaning step, and a dry etch step performed sequentially. The wet etch step and the dry etch step may remove an oxide layer at a surface of the semiconductor material, while the plasma cleaning step may remove impurities such as carbon, fluoride, chloride, and oxygen that are disposed between the oxide layer and the semiconductor material. In some embodiments, the plasma cleaning step is performed by treating the surface of the semiconductor material with hydrogen radicals and atomic hydrogen (e.g., $H_2$ gas). In some embodiments, the three-step cleaning method is used to clean a recess in a fin of a FinFET device in preparation for epitaxial growth of the source/drain region, in which case the plasma cleaning step not only functions as a cleaning process to removes impurities, but also removes portions of the semiconductor material to adjust the profile (e.g., width, depth) of the recess. In some embodiments, by adjusting the pressure of the plasma cleaning step, a ratio between the lateral etch rate and the vertical etch rate of the plasma cleaning step is adjusted, which allows for fine adjustment of the profile of the recess. As a result, the drain induced barrier lowering (DIBL) can be fine tuned, and the channel resistance $R_{ch}$ and the contact resistance $R_{sd}$ of the device can be adjusted (e.g., lowered).

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-8, 9A-9C, 10, 11, 12A, and 12B are cross-sectional views of a FinFET device 100 at various stages of fabrication in accordance with some embodiments. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6-8, 9A, 10, 11, and 12A illustrate cross-sectional views of the FinFET device 100 along cross-section A-A. FIGS. 9B and 9C illustrate embodiment cross-sectional views of the FinFET device 100 along cross-section C-C. FIG. 12B illustrates a cross-sectional view of the FinFET device 100 along cross-section B-B.

Figure 2:
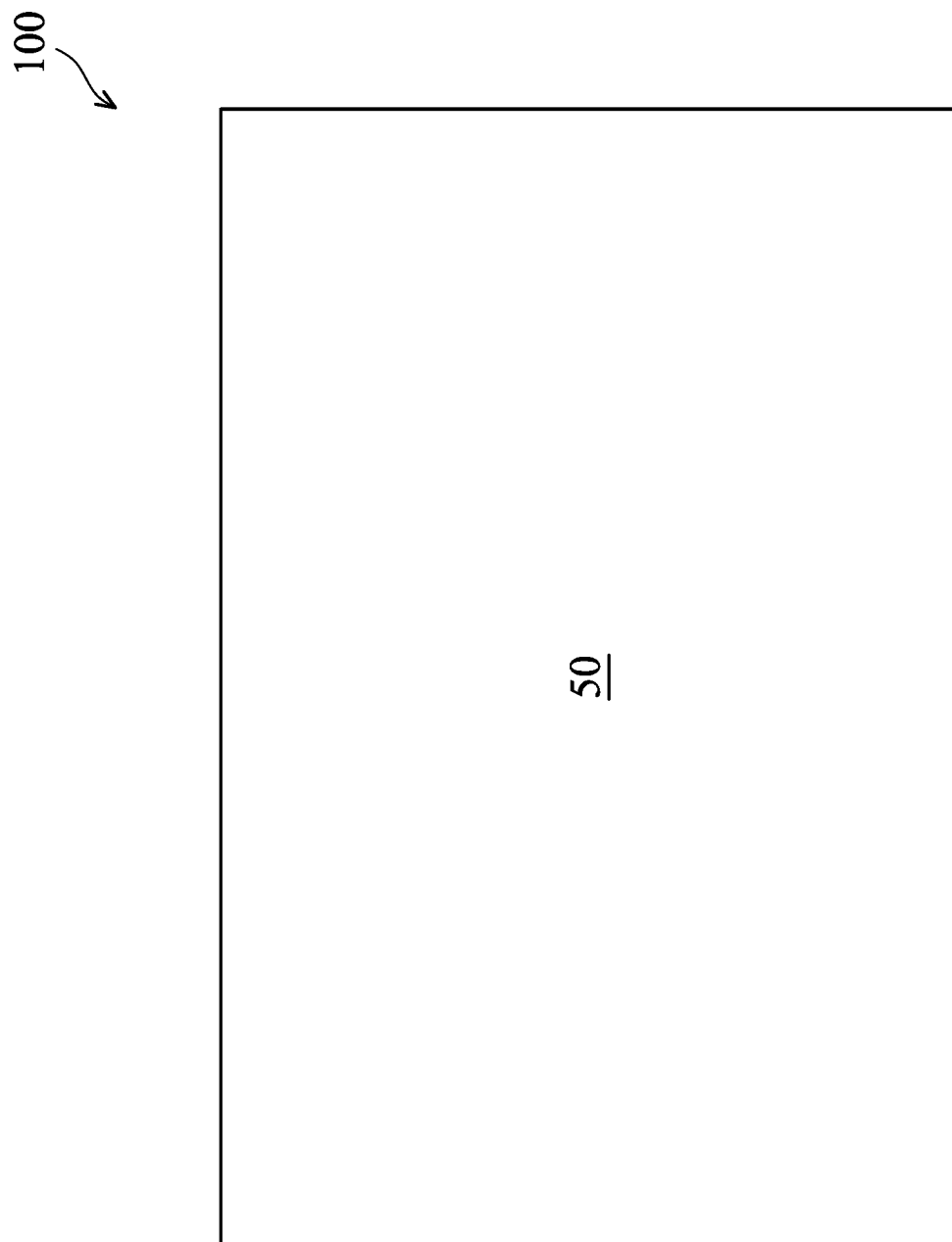
FIGS. 2-8, 9A-9C, 10, 11, 12A, and 12B illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
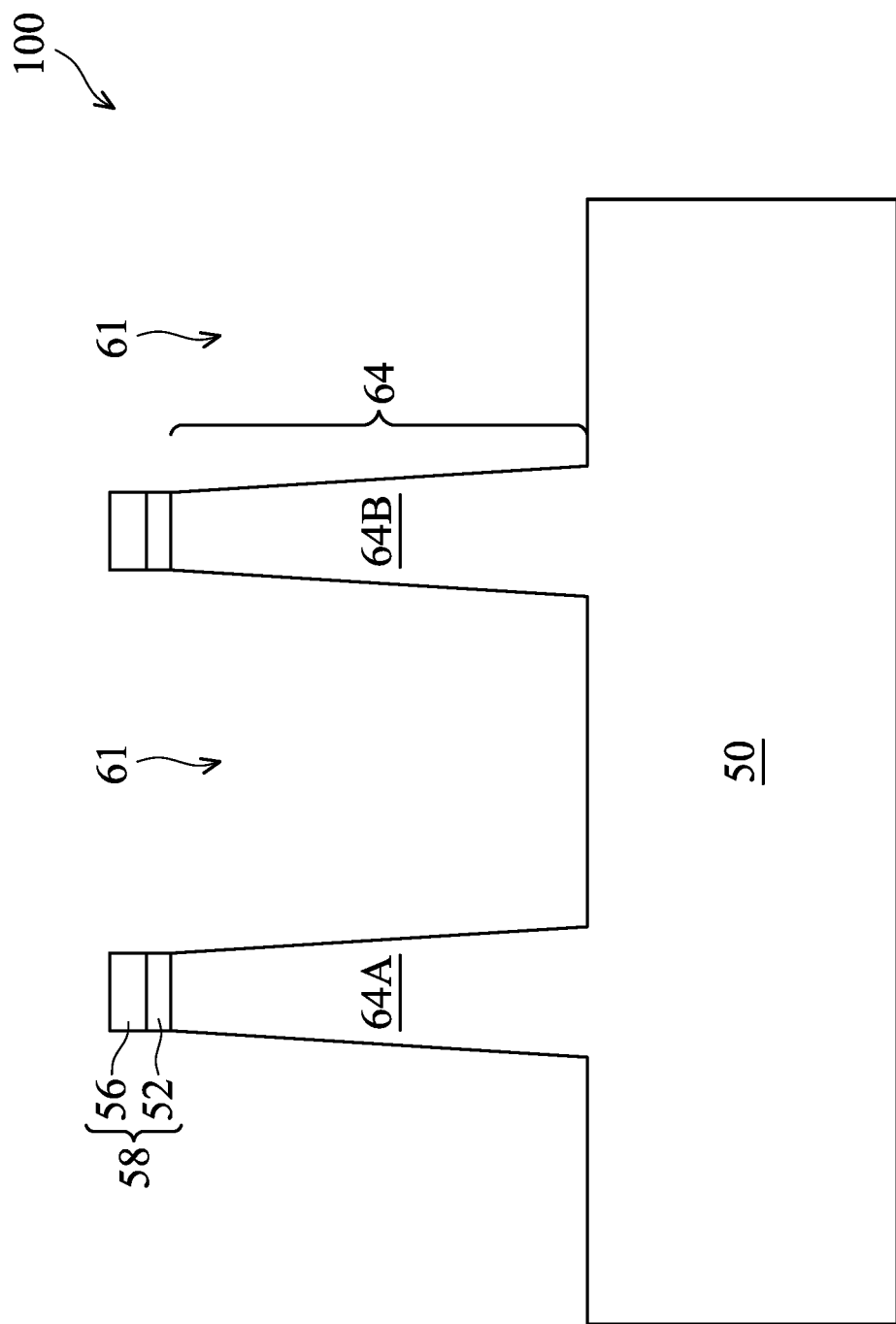

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
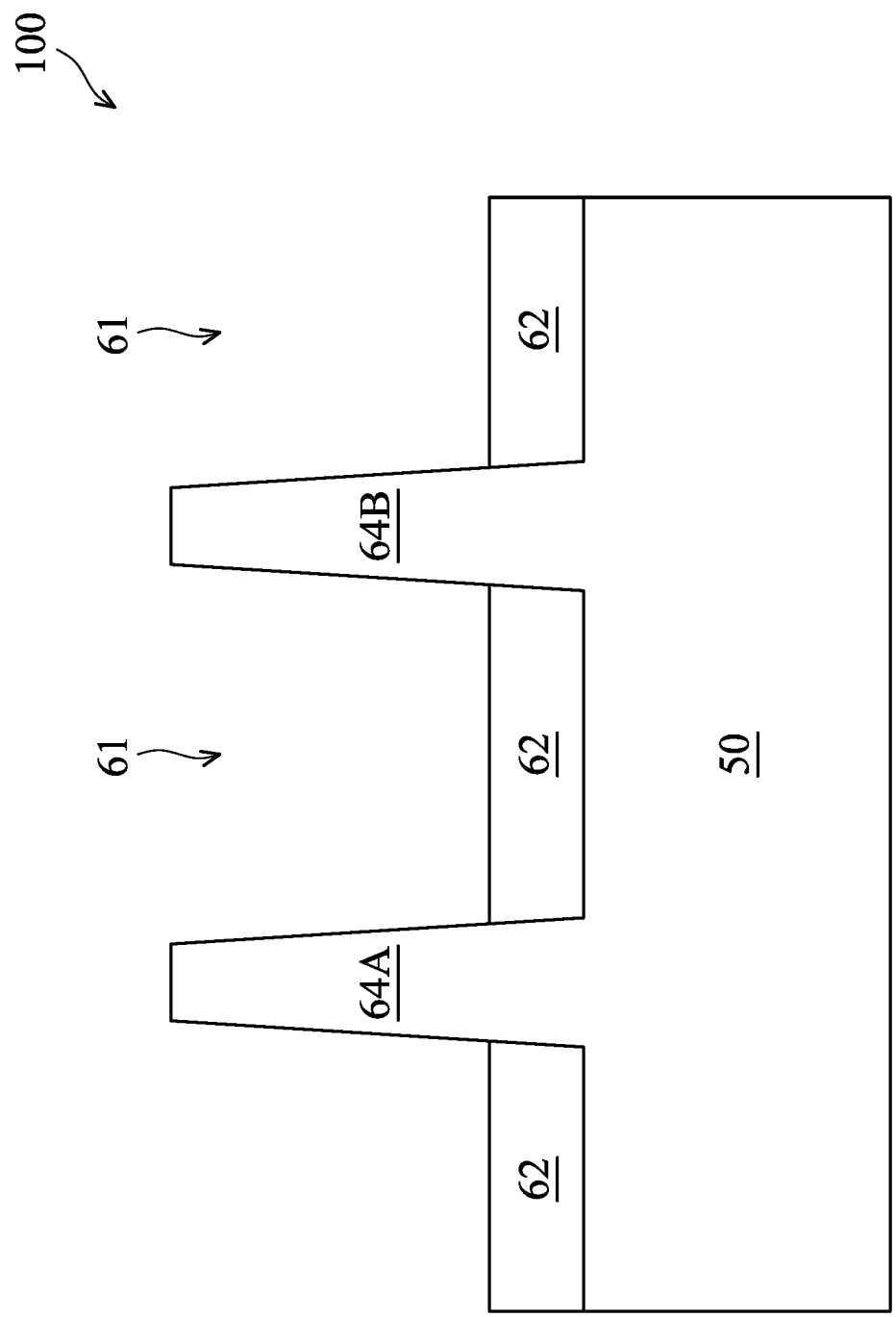

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
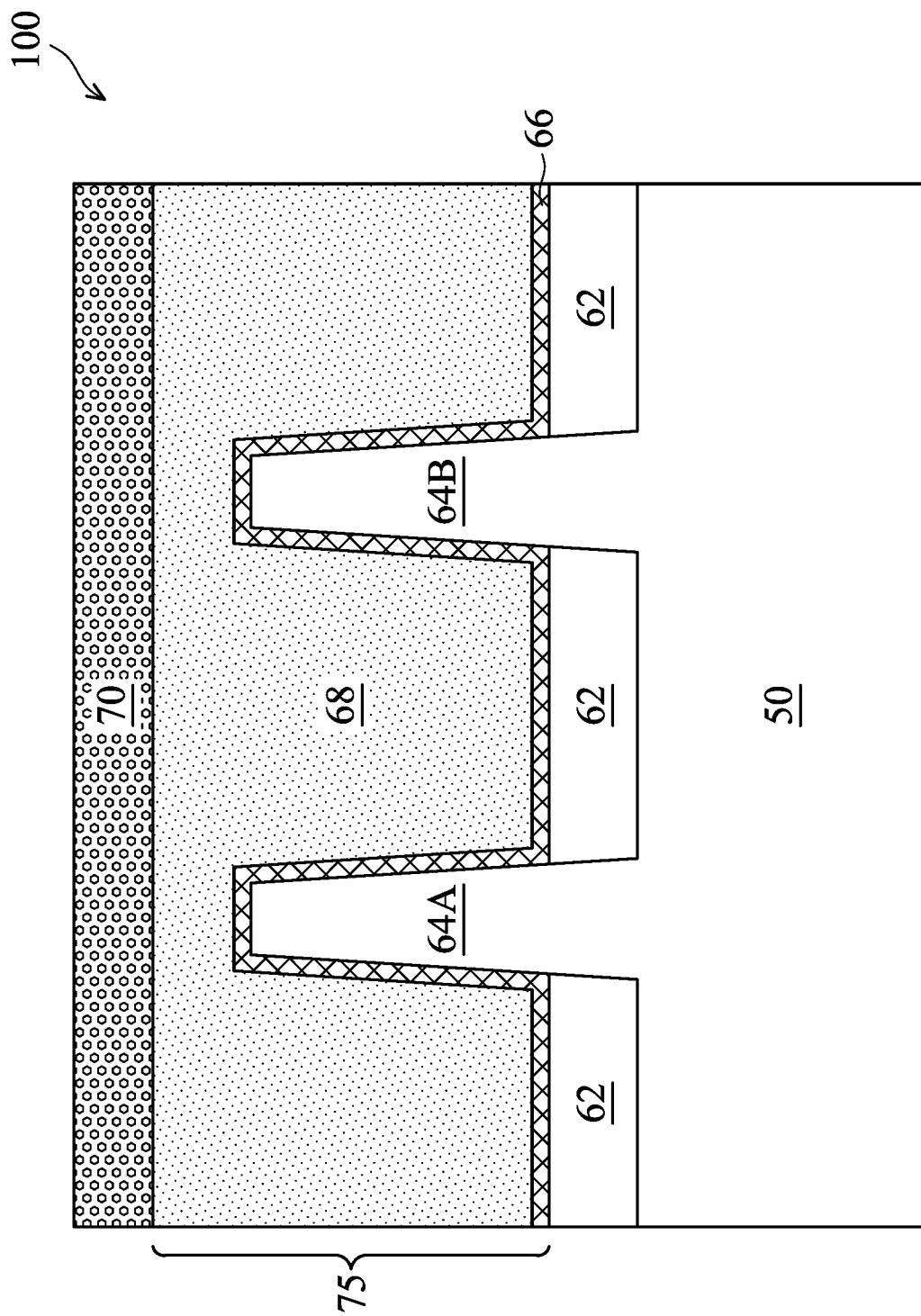

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6-8, 9A, 10, 11, and 12A illustrate the cross-sectional views of further processing of the FinFET device 100 along cross-section A-A (along a longitudinal axis of the fin 64). Note that in FIGS. 6-8, 9A, and 10, three dummy gate structures 75 (e.g., 75A, 75B, and 75C) are formed over the fin 64. One skilled in the art will appreciate that more or less than three gate structures may be formed over the fin 64, these and other variations are fully intended to be included within the scope of the present disclosure.

Figure 6:
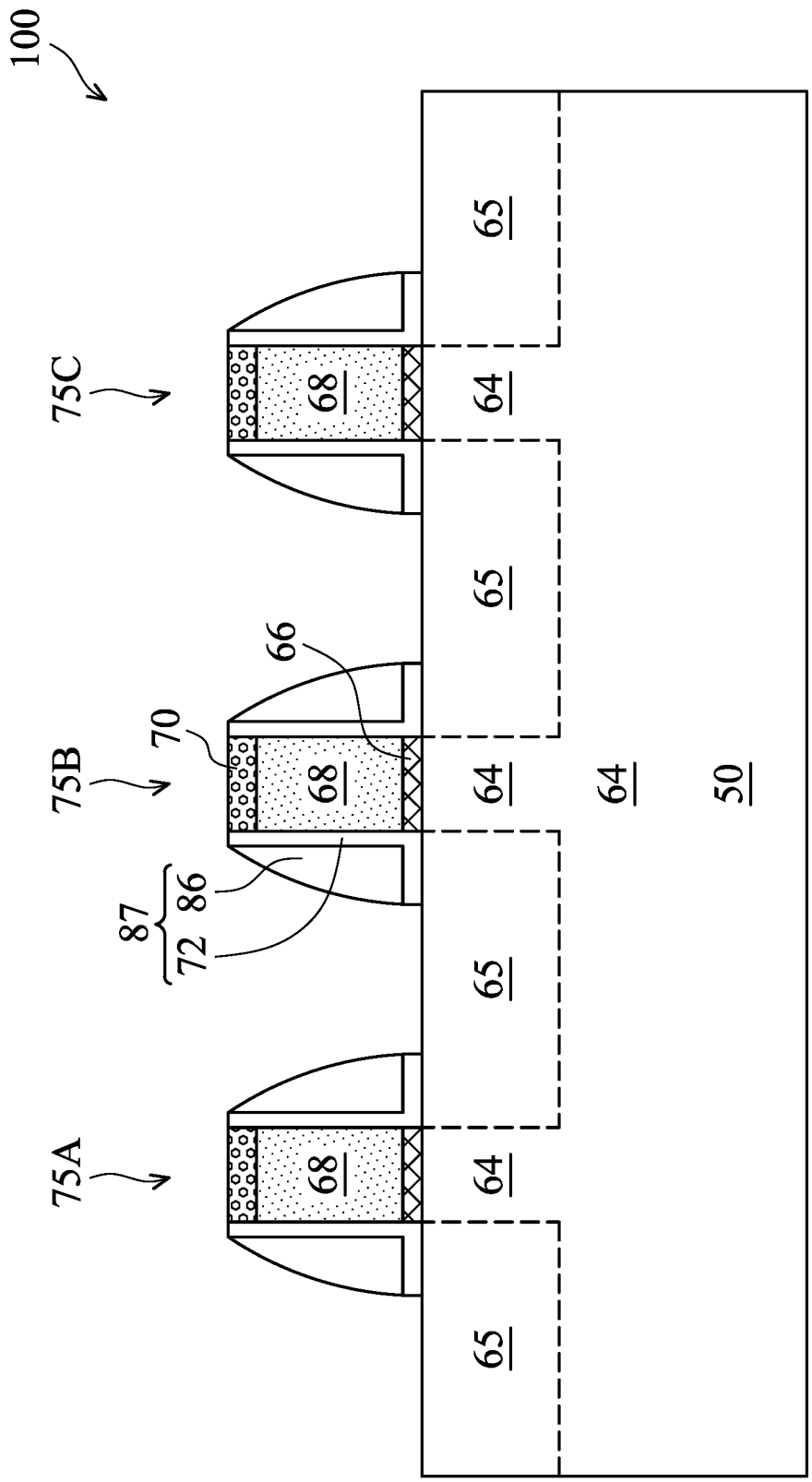

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 87 as illustrated in FIG. 6 are merely non-limiting examples, and other shapes and formation methods are possible. These and other variations are fully intended to be included within the scope of the present disclosure.

Figure 7:
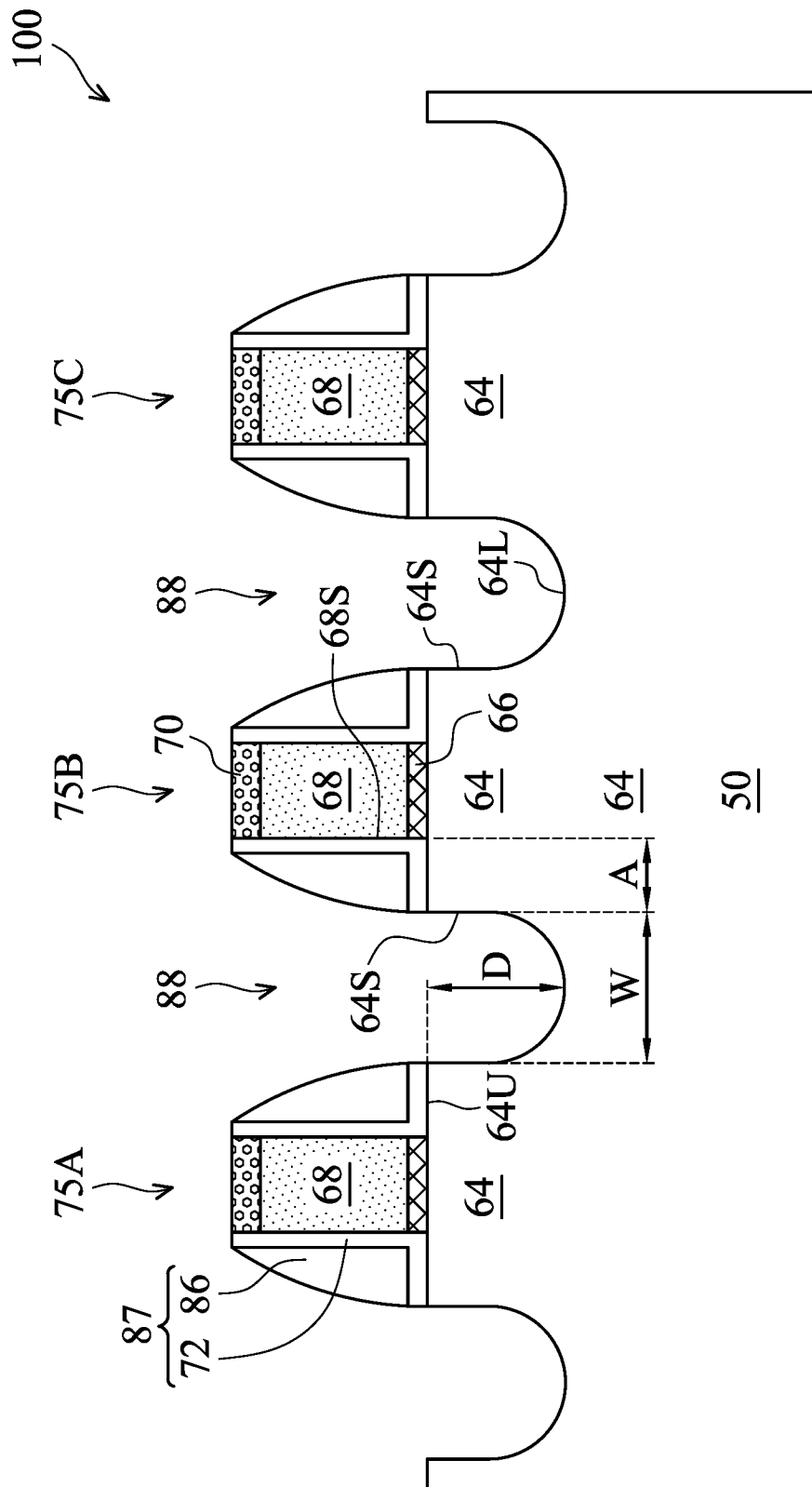

Next, as illustrated in FIG. 7, recesses 88 are formed in the fins 64 adjacent to the dummy gate structures 75, e.g., between adjacent dummy gate structures 75 and/or next to a dummy gate structure 75. The recesses 88 are formed by, e.g., an anisotropic etching process using the dummy gate structures 75 and the gate spacers 87 as an etching mask, in some embodiments, although any other suitable etching process may also be used. The recesses 88 expose sidewalls 64S and lower surfaces 64L of the fin 64, and therefore, the sidewalls 64S and the lower surfaces 64L may also be referred to as surfaces of the fin 64 exposed by the recesses 88. The recess 88 has a depth D, which is measured between an upper surface 64U of the fin 64 and the lower surface 64L (e.g., at the bottom of the recess 88) of the fin 64. FIG. 7 further illustrates a width W of the recess 88 between sidewalls 64S on opposing sides of a recess 88 (e.g., measured along a direction parallel to the upper surface 64U of the fin 64), and a distance A between the sidewall 64S and a respective sidewall 68S of the gate electrode 68.

The etching processing to form the recesses 88 may leave impurities, such as oxygen (O), carbon (C), chlorine (Cl), fluoride (F), or the like, in surface regions of the fin 64 that are exposed by the recesses 88. The impurities may bond with the material (e.g., Si, or SiGe) of the fin 64 at the surfaces (e.g., 64S, 64L) exposed by the recesses 88 to form a thin layer comprising the impurities. In addition, an oxide layer (e.g., silicon oxide layer) may be formed over the thin layer comprising the impurities, which oxide layer may be formed by exposure to oxygen in the ambient, and/or by the previous etching process. The oxide layer and the impurities, if left unremoved, may adversely affect the formation of source/drain regions 80 (see FIG. 9A) in the recesses 88 in subsequent processing and may lower the performance of the device formed.

Figure 8:
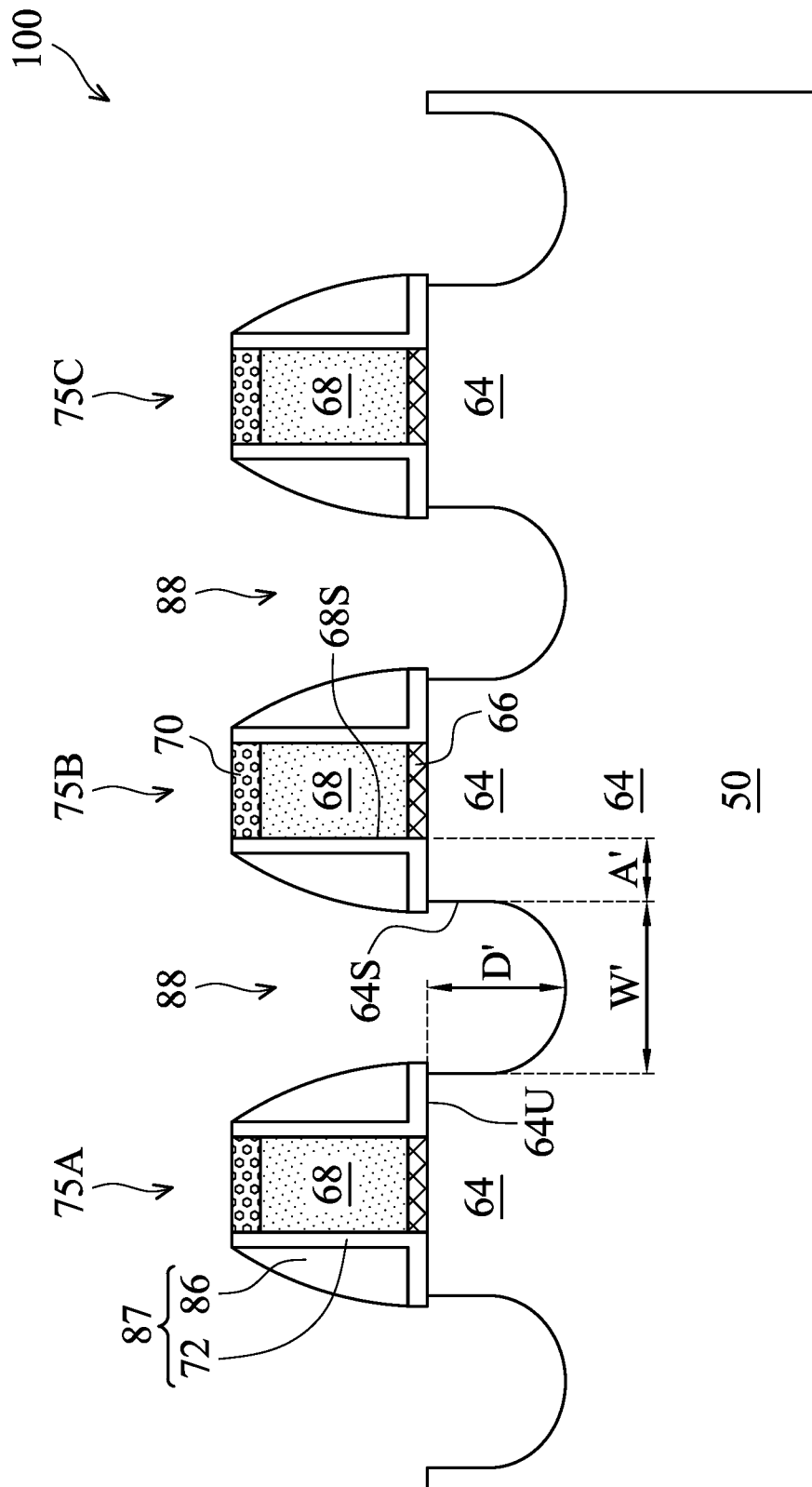

Next, in FIG. 8, the recesses 88 are cleaned before source/drain regions 80 are formed in the recesses 88. In other words, the surfaces (64S, 64L) of the fin 64 exposed by the recesses 88 are cleaned to remove the oxide layer and the impurities prior to forming the source/drain regions 80. Existing cleaning methods (e.g., dry etch, wet etch) used for cleaning the recesses 88, however, are designed for removing oxide and may not be effective in removing the impurities. The present disclosure illustrates various embodiment cleaning methods for cleaning the recesses 88 to effectively remove the oxide layer and the impurities.

In accordance with an embodiment, a cleaning method for cleaning the recess 88 includes three cleaning steps. In particular, a wet etch process is performed as the first cleaning step. Next, a plasma process (also referred to as a plasma cleaning process, or a plasma cleaning step) is performed as the second cleaning step, followed by a dry etch process as the third cleaning step. Details of the wet etch, the plasma process, and the dry etch are discussed hereinafter.

In some embodiments, the wet etch process is performed using a suitable etchant such as diluted hydrofluoric acid (dHF), or a solution comprising di-ionized water and ozone (DIO3). The wet etch process removes oxide at the surfaces regions of the fin 64, in some embodiments. However, the wet etch process, while being used to remove oxide, may itself oxidize the surfaces (e.g., 64S, 64L) of the fin 64 and form a thin layer of oxide over the surfaces of the fin 64.

Next, the plasma process is performed to treat the recesses 88 to remove the impurities at the surface regions of the fin 64 exposed by the recesses 88. In a representative embodiment, the plasma process is performed using a gas source comprising hydrogen ($H_2$). In addition, the gas source includes argon (Ar), helium (He), or a mixture of argon and helium. In other words, the gas source may be a mixture of hydrogen and argon, a mixture of hydrogen and helium, or a mixture of hydrogen, argon, and helium. The gas source is activated into plasma by a plasma generation source, such as a transformer-coupled plasma generator, an inductively coupled plasma system, a magnetically enhanced reactive ion etching system, an electron cyclotron resonance system, a remote plasma generator, or the like. The argon and/or helium may act as an ignition gas during the activation process by colliding with the hydrogen gas to generate hydrogen ions.

In some embodiments, the plasma generation source activates portions of the hydrogen gas in the gas source into plasma, while portions of the hydrogen gas in the gas source remain as atomic hydrogen (e.g., $H_2$ gas). In some embodiments, a filtering mechanism is used in the plasma generation source to filter out electrically charged (e.g., positively charged or negative charged) hydrogen ions while letting through hydrogen radicals (also referred to as H* radicals), which are not electrically charged (e.g., electrically neutral). The hydrogen radicals, together with the atomic hydrogen ($H_2$ gas), are sent to be in contact with the surfaces (e.g., 64S, 64L) of the fins 64 and are used to treat the recesses 88, in some embodiments.

In some embodiments, the hydrogen radicals are small, and therefore, are able to penetrate the oxide layer at the surface regions of the fins 64 to react with the impurities under the oxide layer. For example, the hydrogen radicals may break the bonds (e.g., Si—Si, Si—C, Si—O, Si—Cl, Si—F) between the material of the fin 64 (e.g., Si, SiGe, or SiC) and the impurities (e.g., O, C, Cl, F), and the impurities may then react with the hydrogen radicals to form volatile products (e.g., $H_3CSiH_3$, HF, HCl), which may be removed from a chamber (e.g., a cleaning chamber) the FinFET device 100 is in. The hydrogen radicals may form bonds (e.g., Si—H) with the material of the fin 64, which advantageously prevents or reduces oxidization of the surfaces of the fin 64 in the subsequent etching process (e.g., a dry etching). Note that the hydrogen radicals may also break, e.g., the Si—Si bond at the surfaces (e.g., 64S, 64L) of the fin 64, which may increase the roughness of the surfaces. Since high level of roughness may adversely affect the epitaxial growth of the source/drain regions 80 in the recesses 88, conditions of the plasma process are controlled to keep the roughness of the surfaces (e.g., 64S, 64L) of the fins 64 at an acceptable level, such that the epitaxial growth of the source/drain regions 80 could be performed with little or no adverse impact from the roughness of the surface regions in the recesses 88. Details of the conditions of the plasma processing are discussed hereinafter.

In some embodiments, the plasma process is performed with a gas source comprising hydrogen and an ignition gas, which ignition gas may be argon, helium, or a mixture of argon and helium. The plasma process may be performed with a flow rate of hydrogen between about 10 standard cubic centimeters per minute (sccm) and about 2000 sccm, and a flow rate of the ignition gas (e.g., Ar, He, or a mixture of Ar and He) between about 50 sccm and 6000 sccm. A temperature of the plasma process may be between about 100° C. and about 600° C. A pressure of the plasma process may be between about 0.05 Torr and about 6 Torr, and a duration of the plasma process may be between about 10 seconds and about 100 seconds. Duration of the plasma process may be adjusted in accordance with the temperature of the plasma process, e.g., a shorter duration may be used with a higher temperature, and vice versa.

Still referring to FIG. 8, the hydrogen radicals react with the material of the fin 64 and removes portions of the material of the fin 64. Therefore, the plasma process expands the recesses 88. In particular, the width of the recess 88 is increased to W' after the plasma process. Accordingly, the distance between the sidewall 64S of the fin 64 and the corresponding sidewall 68S of the gate electrode 68 is reduced to A' after the plasma process. The depth of the recess 88 may remain substantially unchanged or may increase slightly to D' after the plasma process, by controlling the condition of the plasma process such that the increase in the depth of the recess 88 is smaller than the increase in the width of the recess 88. Details of which are discussed below.

In some embodiments, the pressure of the plasma process is adjusted (e.g., increased or decreased) to adjust the etch rates (e.g., the removal rate of the material of the fin 64 by the plasma process) of the plasma process along the horizontal direction (e.g., the direction of the width W', or the direction along the longitudinal direction of the fin 64) of FIG. 8 and along the vertical direction (e.g., the direction of the depth D', or the direction perpendicular to the upper surface 64U of the fin 64) of FIG. 8. In other words, the plasma process has a first etch rate along the horizontal direction and has a second etch rate along the vertical direction, where the first etch rate is different from the second etch rate. In the illustrated embodiment, the pressure of the plasma process is controlled such that the first etch rate along the horizontal direction is larger than the second etch rate along the vertical direction. In a representative embodiment, a ratio between the first etch rate and the second etch rate is between 1 and 5. Therefore, the recess 88 is expanded more in the horizontal direction than in the vertical direction. In the discussion herein, the first etch rate may also be referred to as a lateral etch rate, and the second etch rate may also be referred to as a vertical etch rate.

In accordance with some embodiments, increasing the pressure of the plasma process increases the ratio between the first etch rate and the second etch rate, and decreasing the pressure of the plasma process decreases the ratio between the first etch rate and the second etch rate. Therefore, by adjusting the pressure of the plasma process, the profile (e.g., width, depth) of the recess 88 can be adjusted easily and accurately to achieve a targeted profile.

As feature sizes continue to shrink in advanced process nodes, drain induced barrier lowering (DIBL) becomes a more prominent factor that affects the performance of the device formed. In some embodiments, DIBL is determined, at least partially, by the width of the recesses 88. Depend on the process node used and the design of the FinFET device 100, the width of the recesses 88 should be within a pre-determined range to achieve a target DIBL. If the width of the recesses 88 is too large (e.g., larger than the upper bound of the pre-determined range), the DIBL may be too large, and the channel regions under the gate structures may be damaged. If the width of the recesses 88 is too small (e.g., smaller than the lower bound of the pre-determined range), the DIBL may be too small, and the channel resistance ($R_{ch}$) of the device formed may be too high, since the source/drain regions 80 may be too far from the channel region, and as a result, dopants (e.g., B from epitaxial source/drain regions comprising SiGeB, or P from epitaxial source/drain regions comprising SiP) for the channel region may not be able to diffuse from the source/drain regions to reach the right locations in the channel region. In addition, the volume of the source/drain regions 80 formed in the recesses 88 may be too small, which may result in high contact resistance $R_{sd}$.

The etching process used to form the recesses 88 (see discussion above with reference to FIG. 7), however, may not provide the ability to fine tune the dimensions (e.g., width, height) of the recesses 88 to achieve the target DIBL. The presently disclosed plasma process (e.g., used for removing impurities from the recesses 88) provides the additional benefit of being able to fine tune the dimensions of the recesses 88 by controlling the conditions (e.g., pressure) of the plasma process, thereby providing easy and accurate control knobs for fine tuning the channel resistance ($R_{ch}$) and the DIBL. In other words, the plasma process discussed above with reference to FIG. 8 cleans the recesses 88 and modifies the profile of the recesses 88 at the same time.

In the illustrated embodiment, the plasma process has a high etching selectivity between the material (e.g. Si, SiGe, SiC) of the fin 64 and an oxide/nitride. In particular, the hydrogen radials have a high etch rate for, e.g., Si, SiGe, or SiC, but does not etch (e.g., remove) oxide or nitride. Therefore, the plasma process can be performed to remove the impurities and to change the profile of the recesses 88 without attacking other structures of the FinFET device 100, such as the gate spacers 87 and the mask 70.

After the plasma process is finished, a dry etch process (the third cleaning step) is performed to remove oxide from the surfaces (e.g., 64S, 64L) of the fins 64. The dry etch process is performed using a suitable etching gas, such as a mixture of ammonia ($NH_3$) and nitrogen trifluoride (NF3), or a mixture of ammonia ($NH_3$) and hydrogen fluoride (HF). As discussed above, the hydrogen radicals used in the plasma process (the second cleaning step) terminate on (e.g., bond with) the surfaces of the fins 64 to prevent or reduce the formation of oxide by the dry etch process, which illustrates another advantage of the present disclosure. In some embodiments, the three cleaning steps (the wet etch process, the plasma process, and the dry etch process) are performed in a same processing chamber (e.g., the cleaning chamber).

Still referring to FIG. 8, after the dry etch process, the distance A' between the sidewall 64S of the fin 64 and the corresponding sidewall 68S of the gate electrode 68 is less than or equal to 9 nm (e.g., A'≤9 nm). In a representative embodiment, the distance A' is between about 0.1 nm and about 4 nm. The depth D' of the recess 88 is unchanged or increased slightly (e.g., increased by less than 2 nm or less than 1 nm) compared with the depth D of the recess 88 in FIG. 7. In some embodiments, the depth D' is between about 25 nm and about 60 nm.

Figure 9A:
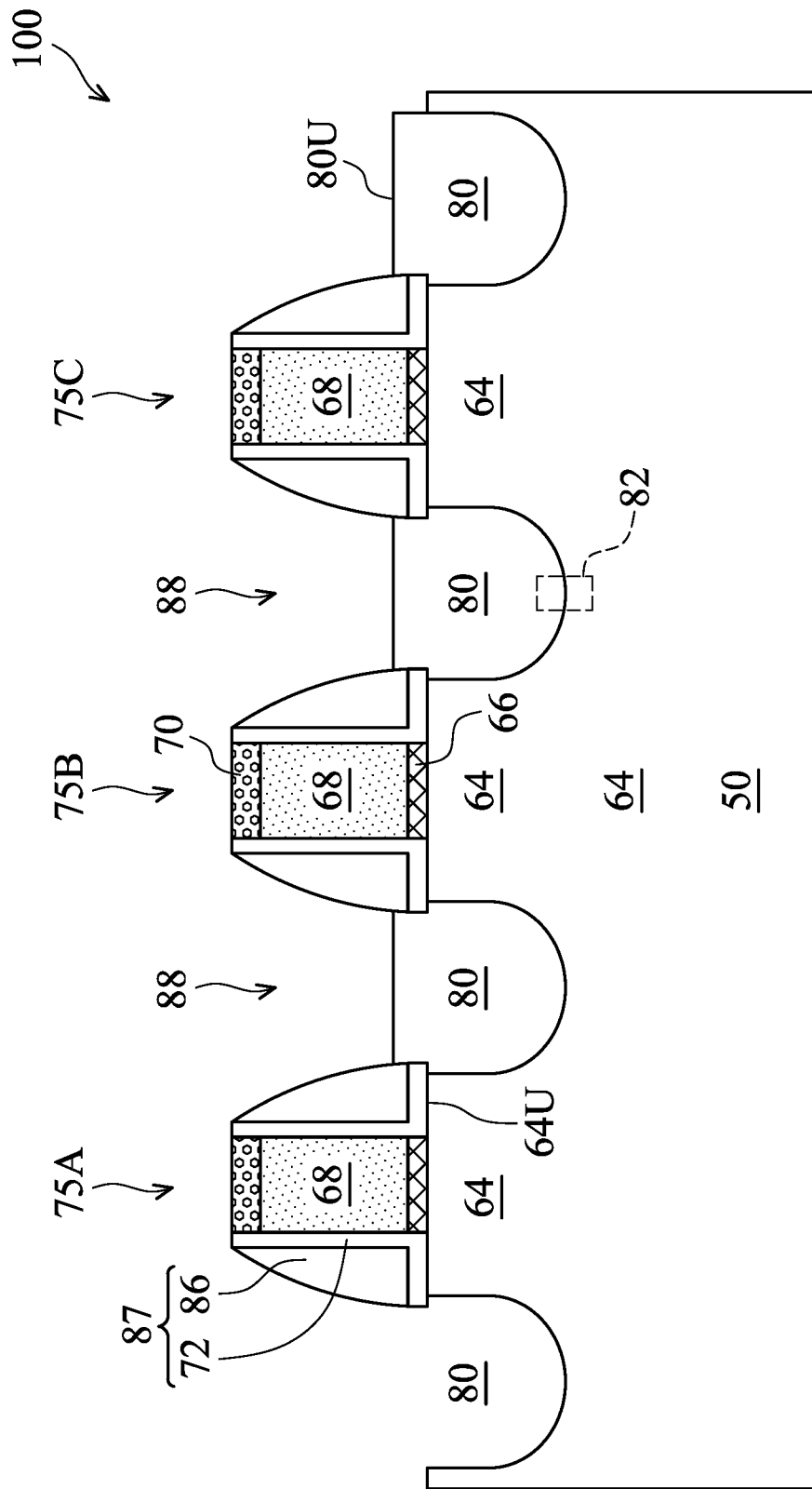
Figure 9B:
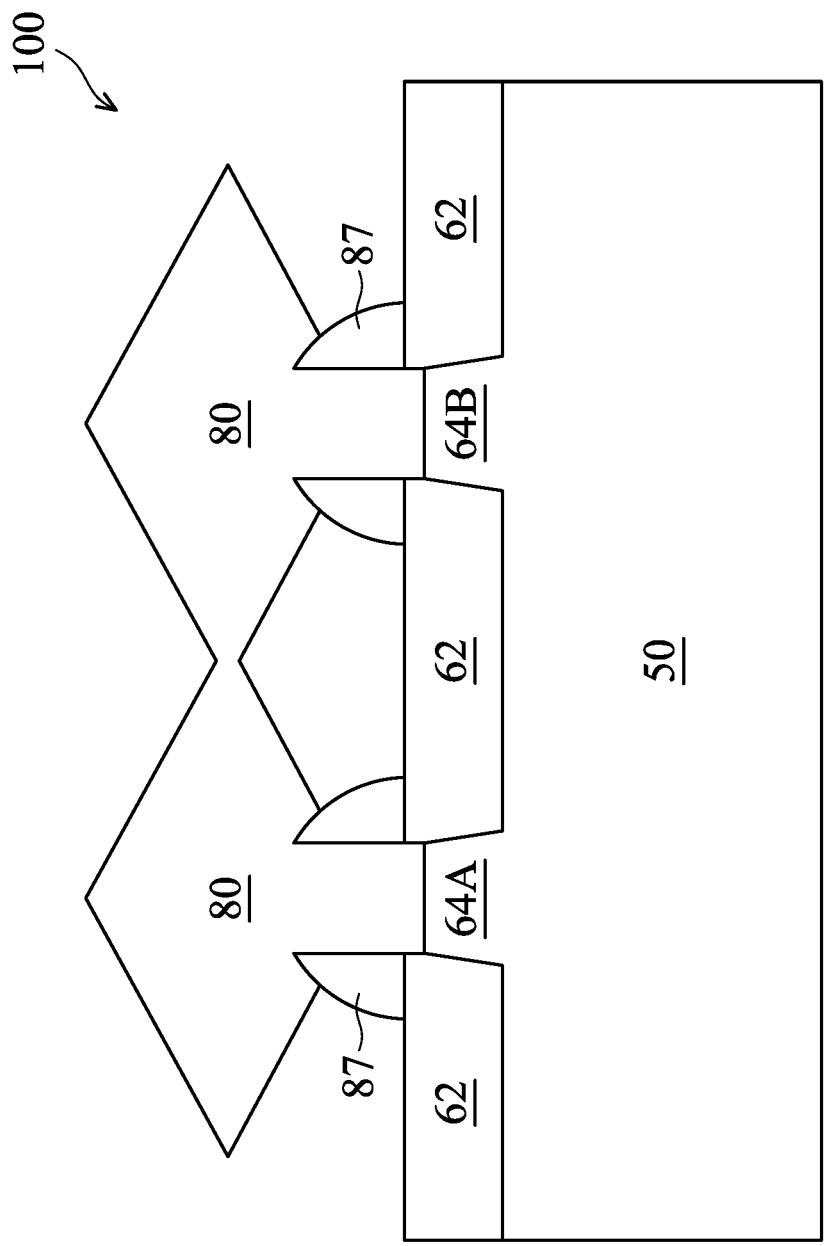
Figure 9C:
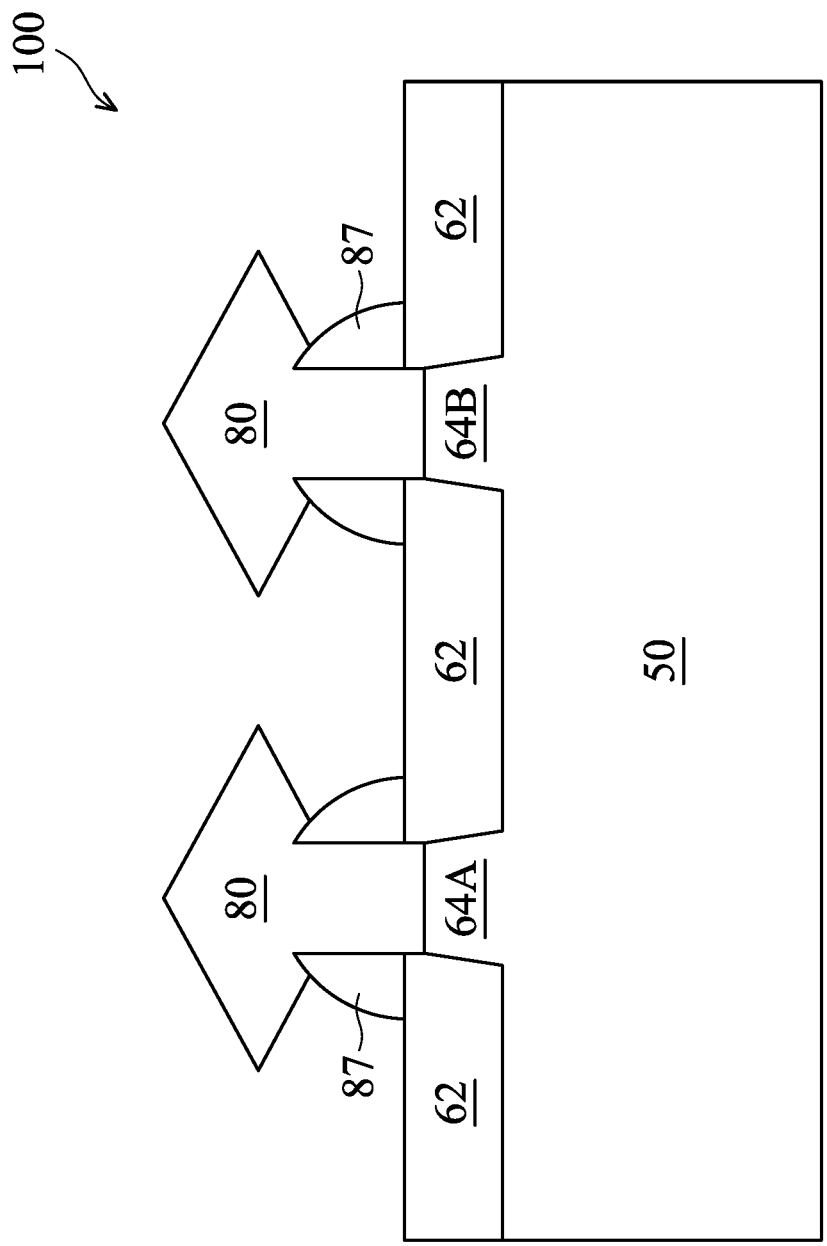

Next, as illustrated in FIG. 9A, the source/drain regions 80 are formed in the recesses 88. The source/drain regions 80 are formed by epitaxially growing a material in the recesses 88, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 9A, the epitaxial source/drain regions 80 may have surfaces raised from respective surfaces of the fins 64 (e.g. raised above the non-recessed portions of the fins 64) and may have facets. In the example of FIG. 9A, the upper surface 80U of the source/drain regions 80 extends above the upper surface 64U of the fin 64 by 3 nm or more. The source/drain regions 80 of the adjacent fins 64 may merge to form a continuous epitaxial source/drain region 80 (see FIG. 9B). In some embodiments, the source/drain regions 80 for adjacent fins 64 do not merge together and remain separate source/drain regions 80 (see FIG. 9C). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about $1E19$ $cm^{-3}$ to about $1E21$ $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

After the source/drain regions 80 are formed, an interfacial concentration of hydrogen (from the hydrogen radicals in the plasma process) in an interface area 82 is larger than about $1E18$ atoms per cubic centimeter ($at/cm^3$), where the interface area 82 is an area at an interface between the source/drain regions 80 and the fin 64. In addition, the interfacial concentration of impurities is reduced by the plasma process. For example, the interfacial concentration of impurities, such as oxygen and carbon, may be reduced to less than $5E19$ $at/cm^3$.

Figure 10:
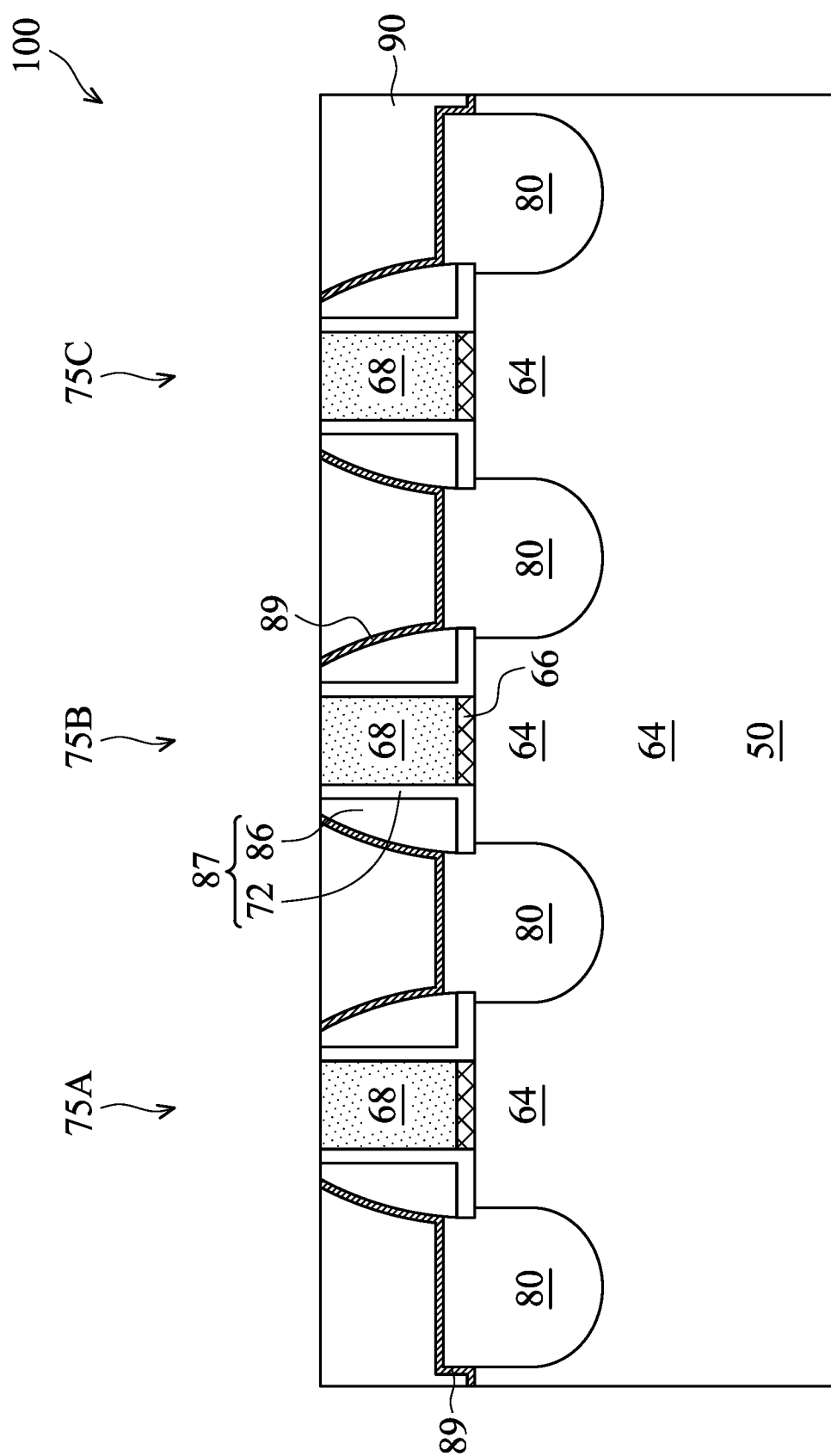

Next, as illustrated in FIG. 10, a contact etch stop layer (CESL) 89 is formed over the structure illustrated in FIG. 9A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68.

Figure 11:
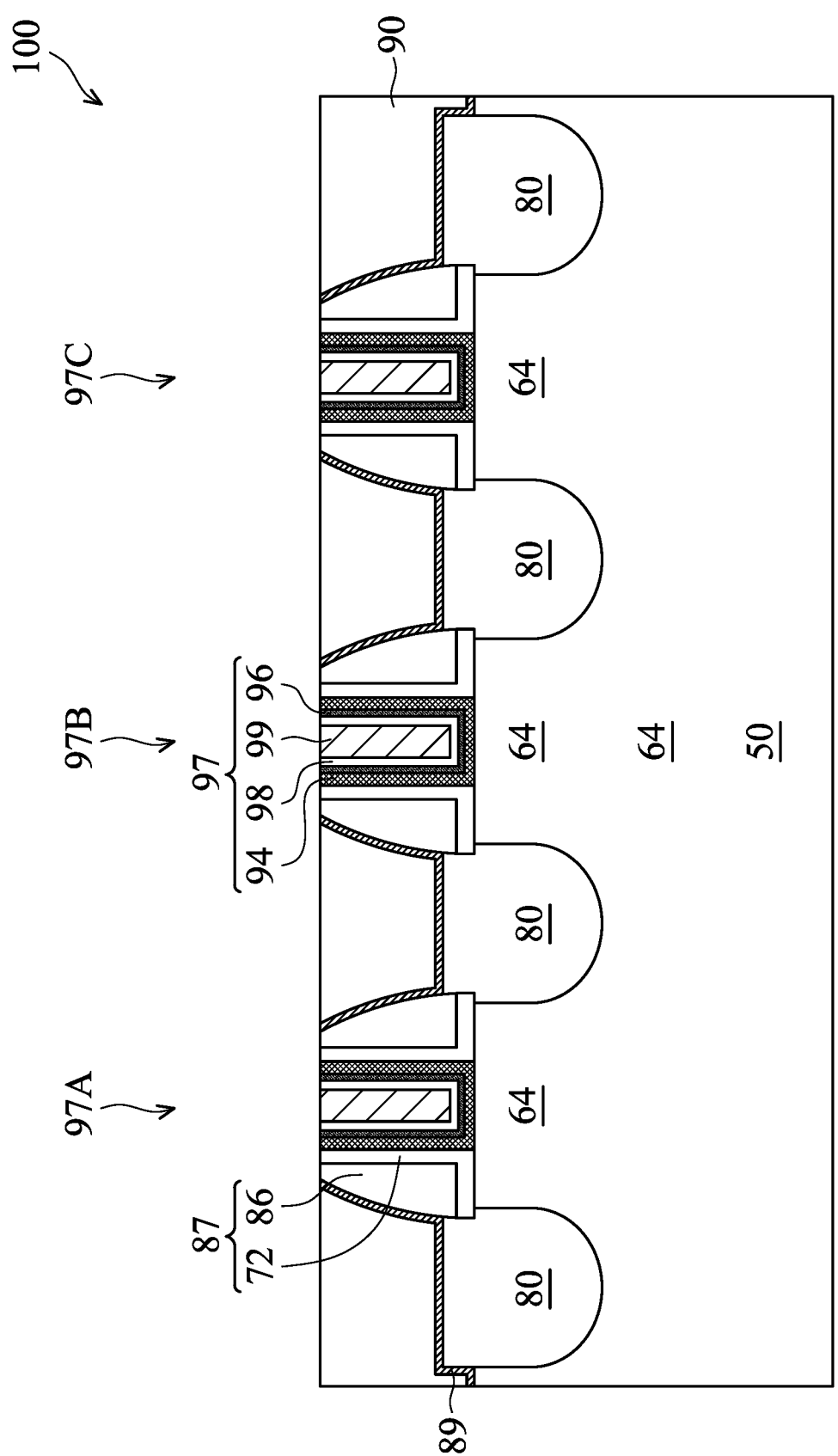

Next, in FIG. 11, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 11, the dummy gate structures 75A, 75B, and 75C (see FIG. 10) are replaced by replacement gate structures 97A, 97B, and 97C, respectively. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a seed layer 98, and a gate electrode 99 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Although not illustrated in FIG. 11, work function layers such as P-type work function layer or N-type work function layer may be formed in the recesses over the barrier layers 96 and before the seed layer 98 is formed, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, the seed layer 98 is formed conformally over the barrier layer 96. The seed layer 98 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 98 comprises a titanium layer and a copper layer over the titanium layer.

Next, the gate electrode 99 is deposited over the seed layer 98, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer (if formed), the seed layer 98, and the gate electrode 99, which excess portions are over the top surface of the first ILD 90. The resulting remaining portions of the gate dielectric layer 94, the barrier layer 96, the work function layer (if formed), the seed layer 98, and the gate electrode 99 thus form the replacement gate structure 97 of the resulting FinFET device 100.

Figure 12A:
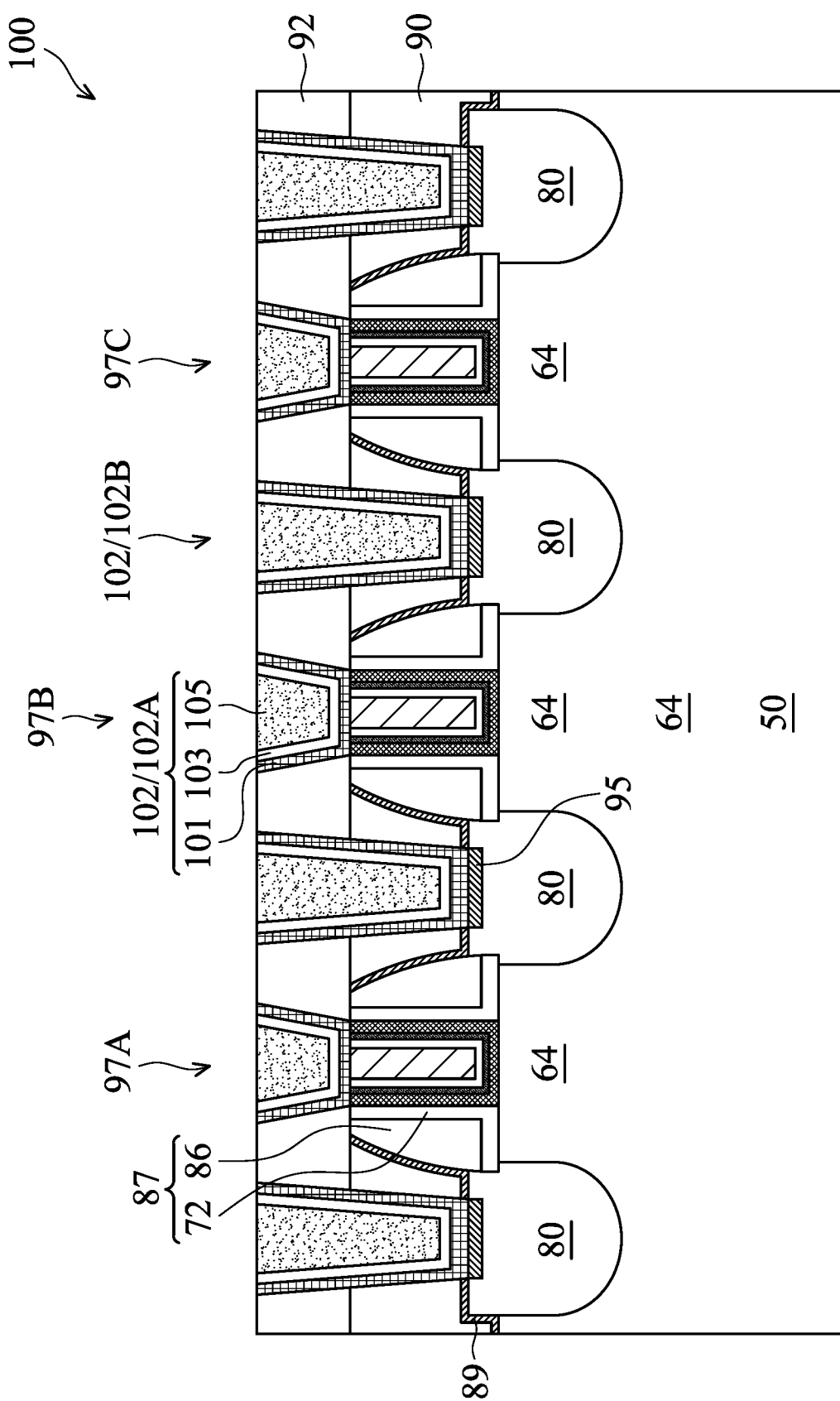
Figure 12B:
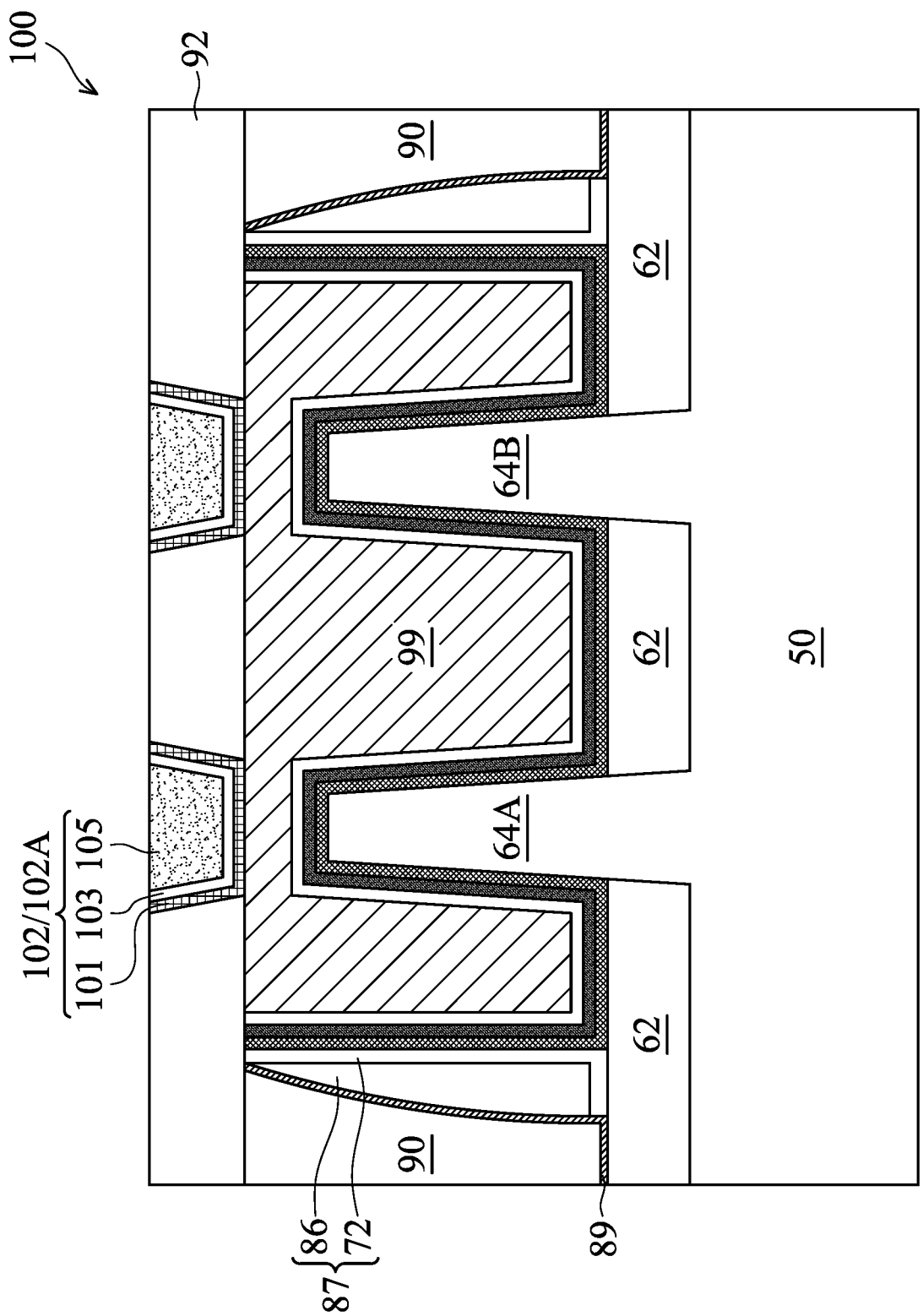

Referring next to FIG. 12A, a second ILD 92 is formed over the first ILD 90. Contact openings are formed through the second ILD 92 to expose the replacement gate structures 97 (e.g., 97A, 97B, and 97C) and to expose the source/drain regions 80. Contacts 102 (e.g., 102A, 102B) are formed in the contact openings.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. The contact openings may be formed using photolithography and etching. The etching process etches through the CESL 89 to expose the source/drain regions 80 and the replacement gate structures 97.

After the contact openings are formed, silicide regions 95 are formed over the source/drain regions 80. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, contacts 102 (e.g., 102A, 102B, may also be referred to as contact plugs) are formed in the contact openings. Each of the contacts 102 includes a barrier layer 101, a seed layer 103, and a conductive material 105, and is electrically coupled to the underlying conductive feature (e.g., replacement gate structure 97, or silicide region 95), in the illustrated embodiment. The contacts 102A that are electrically coupled to the replacement gate structure 97 may be referred to as gate contacts, and the contacts 102B that are electrically coupled to the silicide regions 95 may be referred to as source/drain contacts. The materials and the formation methods for the barrier layers 101, the seed layer 103 and the conductive material 105 may be the same as or similar to those discussed above for the barrier layers 96, the seed layer 98, and the gate electrode 99 of the replacement gate structure 97, respectively, thus details are not repeated. In FIG. 12A, all of the contacts 102 are illustrated in a same cross-section for illustration purpose. This is, of course, an example and not limiting. The contacts 102 may be in different cross-sections.

FIG. 12B illustrates the FinFET device 100 of FIG. 12A, but along cross-section B-B. FIG. 12B illustrates a contact 102 over each of the fins 64A and 64B. The contacts 102 are electrically coupled to the replacement gate structure 97. The number and the locations of the contacts 102 are for illustration purpose only and not limiting, other numbers and other locations are also possible and are fully intended to be included within the scope of the present disclosure.

Variations to the disclosed embodiments are possible and are fully intended to be included within the scope of the present disclosure. For example, the first two cleaning steps of the cleaning method for cleaning the recess 88 discussed above with reference to FIG. 8, such as the wet cleaning process and the plasma process, may be switched with each other to provide flexibility for the integration of the different processing steps in the process flow of the FinFET device 100. In other words, as an alternative embodiment, the cleaning method for cleaning the recess 88 includes three cleaning steps. In particular, a plasma process is performed as the first cleaning step. Next, a wet etch process is performed as the second cleaning step, followed by a dry etch process as the third cleaning step. Details of the plasma process, the wet etch process, and the dry etch process in the alternative embodiment are the same as or similar to those discussed above with reference to FIG. 8, thus details are not repeated. As another example, while embodiments of the present disclosure are discussed in the context of cleaning the recesses 88 for source/drain regions 80, the principle of the present disclosure may be applied to other surface cleaning processes, such as a cleaning process during the formation of the fins 64, where the cleaning process is performed between a first processing step where upper portions of the fins 64 is removed (e.g., by an etching process) and a second processing step where an epitaxial material is grown over the remaining lower portions of the fins 64. As yet another example, while embodiments of the present disclosure are discussed in the context of forming a FinFET device, the cleaning method may also be used for other types of devices, such as planar devices. For example, FIGS. 7 and 8 may be used as cross-sectional views of a planar device, by interpreting regions annotated by numerals 64 and 50 as regions of a substrate of the planar device, and by interpreting dummy gate structures 75 as gate structures of the planar device.

Figure 13:
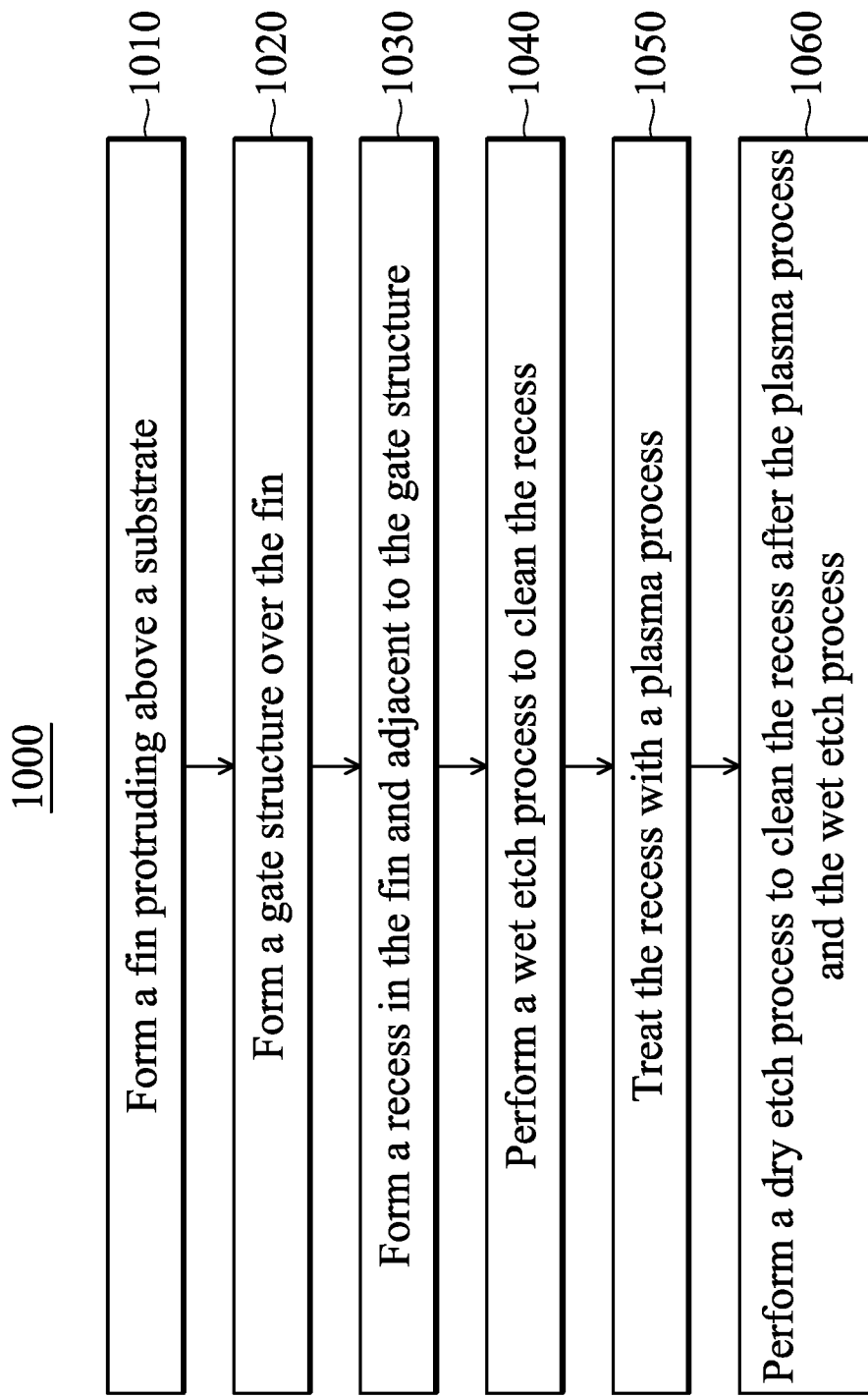
FIG. 13 illustrates a flow chart of method of forming a semiconductor device, in accordance with some embodiments.

FIG. 13 illustrates a flow chart of a method 1000 of forming a semiconductor device, in accordance with some embodiments. It should be understood that the embodiment method shown in FIG. 13 is merely an example of many possible embodiment methods. One of ordinary skill in the art would recognize many variations, alternatives, and modifications. For example, various steps as illustrated in FIG. 13 may be added, removed, replaced, rearranged and repeated.

Referring to FIG. 13, at step 1010, a fin is formed protruding above a substrate. At step 1020, a gate structure is formed over the fin. At step 1030, a recess is formed in the fin and adjacent to the gate structure. At step 1040, a wet etch process is performed to clean the recess. At step 1050, a plasma process is performed to treat the recess. At step 1060, a dry etch process is performed to clean the recess after the plasma process and the wet etch process.

Embodiments may achieve advantages. For example, the disclosed cleaning methods are able to remove impurities and oxide effectively from the recesses 88 and achieve a clean surface for subsequent growth of the epitaxial source/ drain regions 80. As a result, better epitaxial growth for the source/drain regions 80 is achieved. In addition, the source/drain regions 80 formed has better quality, which lowers the contact resistance $R_{sd}$ and allows the source/drain regions 80 to better strain the channel region to boost the device performance. Furthermore, the plasma process of the cleaning method not only removes impurities, but also can be used to achieve fine adjustment of the profile of the recesses 88. As a result, better control of the DIBL and lower channel resistance $R_{ch}$ are achieved.

In an embodiment, a method of forming a semiconductor device includes forming a fin protruding above a substrate; forming a gate structure over the fin; forming a recess in the fin and adjacent to the gate structure; performing a wet etch process to clean the recess; treating the recess with a plasma process; and performing a dry etch process to clean the recess after the plasma process and the wet etch process. In an embodiment, the method further includes forming an epitaxial source/drain region in the recess. In an embodiment, the gate structure includes a gate electrode and gate spacers disposed along sidewalls of the gate electrode, wherein the plasma process expands a width of the recess such that a distance between a sidewall of the recess and a respective sidewall of the gate electrode is reduced. In an embodiment, the plasma process selectively removes a portion of the fin exposed by the recess without attacking the gate spacers of the gate structure. In an embodiment, a depth of the recess remain substantially unchanged by the plasma process. In an embodiment the plasma process removes portions of the fin exposed by the recess at a first etch rate along a first direction and at a second etch rate along a second direction, wherein the first direction is along a longitudinal direction of the fin, the second direction is along a depth direction of the recess, and the first etch rate is larger than the second etch rate. In an embodiment, a ratio between the first etch rate and the second etch rate is between one and five. In an embodiment the method further includes adjusting a ratio between the first etch rate and the second etch rate by changing a pressure of the plasma process. In an embodiment, the plasma process is performed using a gas source comprising hydrogen. In an embodiment, treating the recess includes treating the recess with hydrogen radicals and atomic hydrogen. In an embodiment, the plasma process is performed before the wet etch process. In an embodiment, the wet etch process is performed using diluted hydrofluoric acid, or a solution comprising di-ionized water and ozone. In an embodiment, the dry etch process is performed using a mixture of ammonia and nitrogen trifluoride, or a mixture of ammonia and hydrogen fluoride.

In an embodiment, a method of forming a semiconductor device includes forming a gate structure over a substrate; forming a recess in the substrate and adjacent to the gate structure; performing a plasma process to treat the recess; performing a wet etch process to clean the recess; performing dry etch process to clean the recess; and forming an epitaxial source/drain region in the recess. In an embodiment, the plasma process is performed using a gas source comprising hydrogen. In an embodiment, the plasma process reduces a concentration of impurities in surface regions of the substrate exposed by the recess, wherein the impurities comprise oxygen, carbon, chloride, or fluoride. In an embodiment, wherein the plasma process expands a width of the recess more than a depth of the recess.

In an embodiment, a method of forming a semiconductor device includes forming a gate structure over a semiconductor fin; removing a portion of the semiconductor fin next to the gate structure to form a recess; treating surface regions of the semiconductor fin exposed by the recess using a plasma process, wherein the plasma process expands dimensions of the recess by removing portions of the semiconductor fin exposed by the recess, wherein a width of the recess, measured along a longitudinal direction of the semiconductor fin, is expanded more than a depth of the recess; performing a wet etch process to clean the recess; performing a dry etch process to clean the recess; and epitaxially growing a source/drain region in the recess. In an embodiment, the plasma process is performed using a gas source comprising hydrogen. In an embodiment, the plasma process removes portions of the semiconductor fin along the longitudinal direction of the semiconductor fin at a lateral removal rate, and removes portions of the semiconductor fin along a depth direction of the recess at a vertical removal rate, wherein the method further includes: increasing a pressure of the plasma process to increase a ratio between the lateral removal rate and the vertical removal rate, or decreasing the pressure of the plasma process to decrease the ratio between the lateral removal rate and the vertical removal rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a recess in a semiconductor material;
    performing a wet etch process to clean the recess;
    treating the recess with a plasma process, wherein the plasma process removes the semiconductor material exposed by the recess at a first etch rate along a depth direction of the recess, and simultaneously removes the semiconductor material exposed by the recess at a second etch rate along a lateral direction of the recess perpendicular to the depth direction, wherein the first etch rate is lower than the second etch rate; and
    performing a dry etch process to clean the recess after the plasma process and the wet etch process.

2. The method of claim 1, further comprising adjusting a ratio between the second etch rate and the first etch rate by changing a pressure of the plasma process.

3. The method of claim 2, wherein the plasma process is performed in a single step using a same plasma source for removing the semiconductor material exposed by the recess along the depth direction and along the lateral direction of the recess.

4. The method of claim 1, wherein treating the recess increases a width of the recess more than a depth of the recess.

5. The method of claim 1, wherein the plasma process is performed using a gas source comprising a hydrogen gas.

6. The method of claim 5, wherein treating the recess comprises:
    igniting first portions of the hydrogen gas into a plasma;
    passing the plasma through a filtering mechanism, wherein the filtering mechanism filters out electrically charged hydrogen ions while letting through hydrogen radicals which are not electrically charged; and applying the hydrogen radicals and second portions of the hydrogen gas to the recess.

7. The method of claim 1, wherein treating the recess is performed before the wet etch process.

8. The method of claim 1, further comprising forming a source/drain region in the recess after performing the dry etch process.

9. The method of claim 1, wherein the wet etch process is performed using diluted hydrofluoric acid, or a solution comprising di-ionized water and ozone.

10. The method of claim 1, wherein the dry etch process is performed using a mixture of ammonia and nitrogen trifluoride, or a mixture of ammonia and hydrogen fluoride.

11. A method of forming a semiconductor device, the method comprising:

forming a recess in a substrate adjacent to a gate structure;

performing a plasma process to treat the recess, wherein in a same processing step, the plasma process removes portions of the substrate exposed by the recess along a depth direction of the recess and along a horizontal direction perpendicular to the depth direction, wherein the plasma process has a first etch rate of the substrate along the depth direction and has a second etch rate of the substrate along the horizontal direction, the second etch rate being higher than the first etch rate;

performing a wet etch process to clean the recess; and forming a source/drain region in the recess.

12. The method of claim 11, wherein the plasma process expands a width of the recess more than a depth of the recess.

13. The method of claim 12, further comprising performing a dry etch process to clean the recess after the plasma process and the wet etch process.

14. The method of claim 13, wherein the wet etch process and the dry etch process remove oxide at a surface of the substrate exposed by the recess, wherein the plasma process reduces a concentration of impurities in surface regions of the substrate exposed by the recess, wherein the impurities comprise oxygen, carbon, chloride, or fluoride.

15. The method of claim 11, wherein performing the plasma process comprises applying electrically neutral hydrogen radicals and a hydrogen gas to the recess.

16. The method of claim 15, wherein performing the plasma process comprises, before the applying:

generating a plasma from the hydrogen gas; and filtering out electrically charged ions from the plasma.

17. A method of forming a semiconductor device, the method comprising:

removing a portion of a semiconductor fin to form a recess;

treating surface regions of the semiconductor fin exposed by the recess using a plasma process, wherein the plasma process fine-tunes a drain induced barrier lowering (DIBL) of the semiconductor device into a predetermined range by changing a profile of the recess, wherein the plasma process changes the profile of the recess by simultaneously expanding the recess along a depth direction of the recess at a first speed and along a lateral direction of the recess at a second speed faster than the first speed;

performing a wet etch process to clean the recess; and performing a dry etch process to clean the recess.

18. The method of claim 17, further comprising epitaxially growing a source/drain region in the recess.

19. The method of claim 17, wherein the plasma process expands dimensions of the recess, wherein a width of the recess, measured along a longitudinal direction of the semiconductor fin, is expanded more than a depth of the recess by the plasma process.

20. The method of claim 17, further comprising forming a gate structure over the semiconductor fin before removing the portion of the semiconductor fin, wherein the recess is formed adjacent to the gate structure, wherein a distance between a sidewall of the recess and a closest gate spacer along a sidewall of the gate structure is reduced by the plasma process.

* * * * *